United States Patent [19]
Harris

[11] Patent Number: 4,815,033
[45] Date of Patent: Mar. 21, 1989

[54] METHOD AND APPARATUS FOR ACCESSING A COLOR PALETTE SYNCHRONOUSLY DURING REFRESHING OF A MONITOR AND ASYNCHRONOUSLY DURING UPDATING OF THE PALETTE

[75] Inventor: Steven Harris, Milpitas, Calif.

[73] Assignee: Advanced Micro Devices, Inc., Sunnyvale, Calif.

[21] Appl. No.: 807,393

[22] Filed: Dec. 10, 1985

[51] Int. Cl.[4] ......................... G06F 15/20; G11C 8/00
[52] U.S. Cl. ..................................... 364/900; 365/233
[58] Field of Search ... 364/200 MS File, 900 MS File; 365/233

[56] References Cited

U.S. PATENT DOCUMENTS 4,564,926 1/1986 Nikaido et al. ................. 365/233 X
4,623,986 11/1986 Chauvel ............................ 364/900

*Primary Examiner*—Raulfe B. Zache
*Attorney, Agent, or Firm*—Elmer W. Galbi; Joseph A. Sawyer, Jr.; Warren M. Becker

[57] ABSTRACT

A method and apparatus for accessing a color palette in a color graphics system synchronously and asynchronously. Address and data registers coupled to the color palette are operated synchronously in a pipeline fashion using clock pulses having a pixel scanning rate when the palette is used for refreshing a color monitor. The address and data registers are operated asynchronously, i.e. rendered transparent to addresses and data, respectively, when the palette is updated by a CPU.

25 Claims, 2 Drawing Sheets

| MODE | $\overline{CS}$ | $\overline{W}/R$ | SI | SO |
|---|---|---|---|---|
| READ | 0 | 1 | 0 | 1 |
| WRITE | 0 | 0 | 0 | 0 |
| REFRESH | 1 | X | 1 | 1 |

| LINE | CLK | SI $\overline{TRANS}$ | OUT |
|---|---|---|---|
| 1 | 0 | 1 | IN |
| 2 | 1 | 1 | OFF |
| 3 | 0 | 0 | IN |
| 4 | 1 | 0 | IN |

| LINE | CLK | SI $\overline{TRANS}$ | OUT |
|---|---|---|---|
| 1 | 0 | 1 | OFF |
| 2 | 1 | 1 | IN |
| 3 | 0 | 0 | OFF |
| 4 | 1 | 0 | OFF |

| LINE | CLK | SI $\overline{TRANS}$ | OUT |
|---|---|---|---|
| 1 | 0 | 1 | OFF |
| 2 | 1 | 1 | IN |
| 3 | 0 | 0 | IN |
| 4 | 1 | 0 | IN |

| LINE | CLK | SI $\overline{TRANS}$ | OUT |
|---|---|---|---|
| 1 | 0 | 1 | IN |
| 2 | 1 | 1 | OFF |
| 3 | 0 | 0 | OFF |
| 4 | 1 | 0 | OFF |

METHOD AND APPARATUS FOR ACCESSING A COLOR PALETTE SYNCHRONOUSLY DURING REFRESHING OF A MONITOR AND ASYNCHRONOUSLY DURING UPDATING OF THE PALETTE

BACKGROUND OF THE INVENTION

1. Field of the Invention

The present invention relates in general to a method and an apparatus for accessing a pipelined color palette in a color graphics system and in particular to a method and apparatus for selectively accessing a pipelined color palette synchronously when the palette is being used for refreshing a color monitor and asynchronously when the palette is being updated by a central processing unit.

2. Description of Prior Art

A pipelined graphics color palette, also known as a color table look-up memory, comprises a random access memory (RAM) in which there is provided a plurality of storage locations for storing a plurality of words wherein each word defines a particular color to be displayed on a color monitor.

In a typical color graphics system, the palette is coupled to an address register and a data register and access to the palette is required when the palette is being used for refreshing the color monitor during a refresh mode and when the contents of the palette are being updated by a central processing unit (CPU) during a palette update mode.

In addition to the color palette, the address register, the data register, the CPU and the color monitor, there is also provided in the typical color graphics system a video display memory, a shift register, a multiplexer, a plurality of digital-to-analog converters (DAC's) which are coupled to one or more electron guns in the monitor and a video timing generator for providing a pixel clock.

The typical color graphics system is selectively operable in either of two modes: a refresh mode or a palette update mode.

For use in the refresh mode, there is stored in the video display memory a plurality of words. Each of the words corresponds to a separate triad of red, blue and green pixels on the monitor screen and comprises an address of one of the words stored in the color palette.

In the refresh mode, the words stored in the display memory are read out of the display memory into the shift register and from the shift register, via a video address bus, through the multiplexer, into the address register. Control signals for switching the multiplexer are provided by the CPU. As each word from the display memory enters the address register, the word is used for addressing one of the words in the color palette.

The words addressed in the color palette are then read out to the data register. From the data register, the words are transferred to the DAC's. In the DAC's, the words are converted to analog signals. The analog signals are then used to control the outputs of the electron guns while the guns are scanning the triads on the monitor. Controlling the guns controls the intensity of each pixel in the triads and therefore the color of the triads.

The above-described operations of transferring addresses from the display memory to the address register for addressing the color palette, and the transferring of words from the palette to the data register and then to the DAC's for refreshing the monitor are synchronized with the pixel clock in a pipeline manner. That is, in response to each pixel clock pulse, a word is read out of the color palette into the data register and the DAC's and, at the same time in response to the same clock pulse, a new word from the display memory is read into the address register to address the color palette.

In the color palette update mode, addresses from the CPU are transferred via a CPU system address bus through the multiplexer to the address register for addressing the palette and data words are transferred between the CPU and the palette on a CPU system data bus for changing the colors in the palette. At the same time, the CPU provides chip enable and read/write control signals for controlling the data transfers into and out of the palette.

Heretofore, the addressing of and data transfers to and from the palette using CPU addresses in the palette update mode required that the CPU addresses and CPU data transfers be synchronized with either pixel clock pulses used during the refresh mode or with CPU system clock pulses used in normal CPU data transfers.

It has been found that the use of either the pixel clock or the CPU clock for synchronizing CPU addressing and data transfers between the CPU and the color palette has certain disadvantages.

One of the disadvantages found is that synchronized address inputs to the color palette address register in general must meet specified set-up and hold times.

When using the pixel clock, there is another disadvantage. Because the CPU system clock and the typical pixel clock comprise considerably different pulse rates, a complex CPU address synchronizer is required when using the pixel clock.

To avoid using the pixel clock and the required synchronizer, it has been proposed to use the CPU system clock. However, one of the disadvantages of using the CPU system clock is that switching between the pixel and system clocks can result in a loss of data due to noise spikes or extraneous pulses appearing on the clock inputs to the address and data register.

SUMMARY OF THE INVENTION

In view of the foregoing, principal objects of the present invention are a method and an apparatus for selectively providing both synchronous and asynchronous addressing of a color palette in a color graphics system.

Other objects of the present invention are a method and an apparatus for selectively accessing a pipelined color palette synchronously when the palette is being used for refreshing a color monitor and asynchronously when the palette is being updated by a central processing unit.

In accordance with the above objects there is provided in a color graphics system, a CPU, a video display memory, a shift register, a multiplexer, a pipelined color palette coupled to an address register and a data register, a plurality of digital-to-analog converters (DAC's), a color monitor and a source of pixel clock pulses.

In each of the address and data registers, there is provided an input for receiving input signals, an output for providing output signals, an input for receiving the pixel clock pulses, and means responsive to a first and a second control signal from the CPU for selectively rendering each of the registers transparent to said input signals. That is, when the registers are operating in their normal manner, signals applied to the inputs of the registers are transferred to the outputs of the registers in synchronism with the pixel clock pulses. However, when the registers are rendered transparent, signals presented at the inputs of the registers are transferred to the outputs of the registers independent of the pixel clock pulses applied thereto.

The above-described address and data registers are used in a refresh mode and in a color palette update mode in the following manner.

In the refresh mode, words from the display memory are transferred from the display memory through the shift registers and the multiplexer to the address register for addressing the color palette. The addressed words from the palette are then transferred to the DAC's and converted to analog signals for refreshing the color monitor. In this mode and in response to a first control signal from the CPU, pixel clock pulses are used for synchronizing the address and data registers.

In the palette update mode, addresses from the CPU in response to control signals from the CPU are transferred from the CPU through the multiplexer to the address register for addressing the color palette. During this time, and in response to a second control signal from the CPU, the address and data registers are rendered transparent to addresses and data applied to their inputs, respectively. By rendering the registers transparent, the addressing of and the data transfer between the CPU and the color palette are rendered asynchronous and independent of the pixel clock.

BRIEF DESCRIPTION OF THE DRAWING

The above and other objects, features and advantages of the present invention will become apparent from the following detailed description of the accompanying drawing, in which.

DETAILED DESCRIPTION OF THE DRAWING

Figures 1, 2:
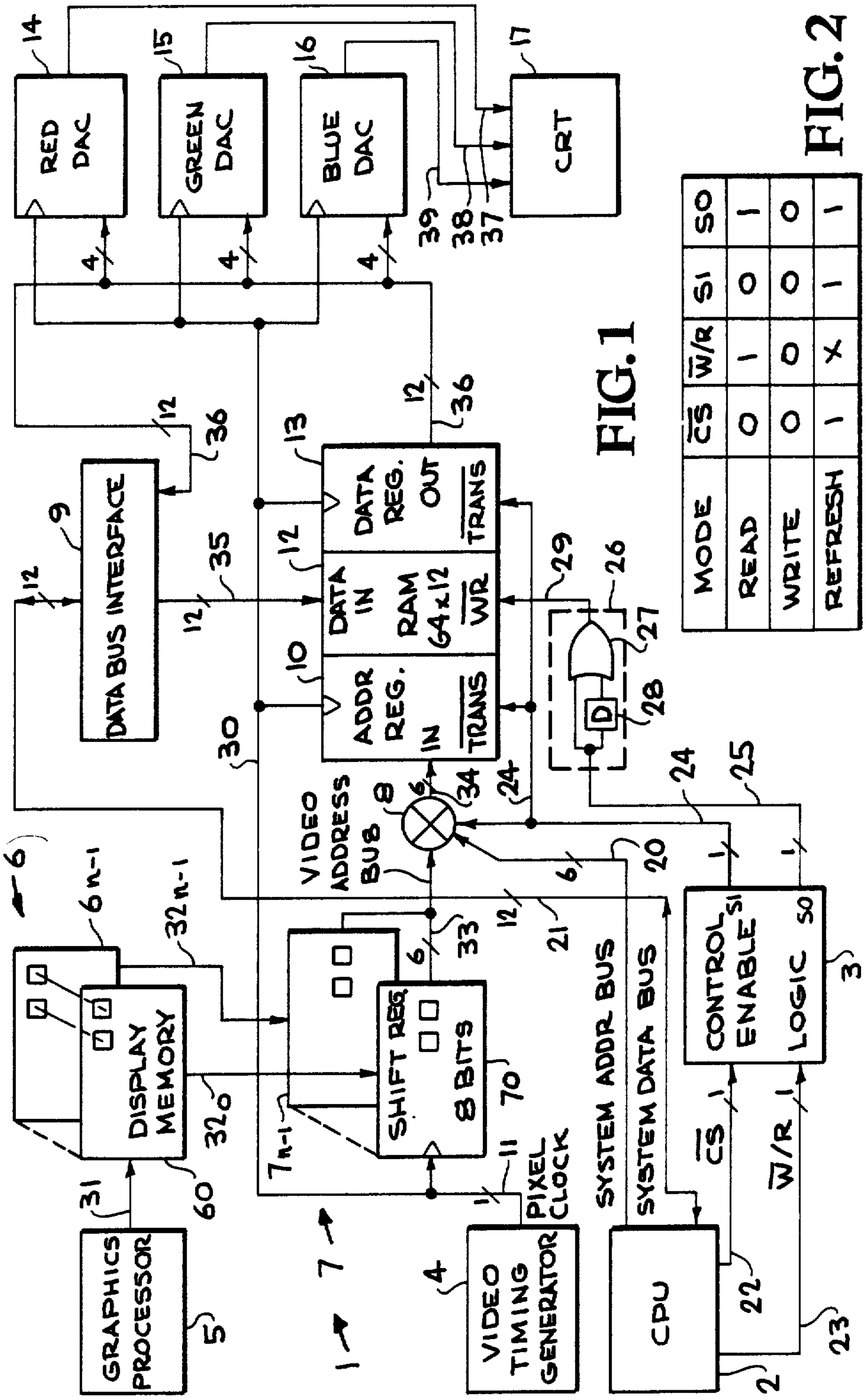
FIG. 1 is a block diagram of an embodiment of the present invention.
FIG. 2 is a truth table descriptive of the operation of the embodiment of FIG. 1.

Referring to FIGS. 1 and 2, there is provided in accordance with the present invention a graphics system designated generally as 1. In the system 1 there is provided a central processing unit (CPU) 2, a control enable logic circuit 3, a video timing generator 4, a graphics processor 5, a video display memory designated generally as 6 comprising a plurality of n memory planes $6_0$–$6_{n-1}$, a plurality of shift register circuits designated generally as 7 comprising a plurality of n 8-bit shift registers $7_0$–$7_{n-1}$, a multiplexer 8, a data bus interface circuit 9, an address register 10, a color table look-up random access memory (RAM) 12, also called a color palette, a data register 13, a plurality of digital-to-analog converters 14, 15 and 16, also designated red, green and blue, and a video monitor 17.

The CPU 2 is coupled to a first 6-bit address input of the multiplexer 8 by means of a six line system address bus 20, a 12-bit data input of the data bus interface circuit 9 by means of a bidirectional twelve line system data bus 21 and the control enable logic circuit 3 by means of a chip-enable ($\overline{CS}$) control signal line 22 and a write/read ($\overline{W}$/R) control signal line 23.

The control enable logic circuit 3 is provided with two outputs designated S1 and S0. The output S1 is coupled to a control signal input of the multiplexer 8, a control signal input $\overline{TRANS}$ of the address register 10 and a control signal input $\overline{TRANS}$ of the data register 13 by means of a control signal line 24. The output S0 is coupled to a control signal input $\overline{WR}$ of the memory 12 by means of a control signal line 25, a unidirectional delay circuit designated generally as 26 comprising an OR gate 27 and a delay circuit 28, and a control signal line 29.

The video timing generator 4 is coupled to a pixel clock input of each of the shift registers $7_0$– $7_{n-1}$, the address register 10, the data register 13, and the digital-to-analog converters 14–16 by means of a clock signal line 30.

The graphics processor 5 is coupled to the display memory 6 by means of a signal bus 31 for storing words in and controlling the operation of the display memory 6.

In the video display memory 6 there is provided in each of the n planes of storage locations or memory cells designated $6_0$–$6_{n-1}$, one cell for storing a bit of each word stored in the memory.

The planes $6_0$–$6_{n-1}$ of the video display memory 6 are coupled to corresponding ones of the shift registers $7_0$–$7_{n-1}$ by means of a plurality of signal lines $32_0$–$32_{n-1}$.

An output of the shift registers 7 is coupled to a second 6-bit address input of the multiplexer 8 by means of a video address bus 33.

In addition to the control signal input coupled to the control signal line 24 and the first and second address inputs coupled to the system address bus 20 and the video address bus 33, respectively, the multiplexer 8 is also provided with an output coupled to a 6-bit address input of the address register 10 by means of a six line address bus 34.

The data bus interface circuit 9 is coupled to a 12-bit data input DATA IN of the memory 12 by means of a twelve line data bus 35.

In addition to the control signal input $\overline{TRANS}$ coupled to the control signal line 24 and the clock input coupled to the pixel clock signal line 30, the data register 13 is provided with a 12-bit output coupled to the data bus interface circuit 9 and the digital-to-analog converters (DAC's) 14, 15 and 16 by means of a data bus 36. Each of the DAC's 14–16 are coupled to four of the data lines.

The digital-to-analog converters 14–16 are coupled to the monitor 17 by means of a plurality of analog signal lines 37, 38 and 39, respectively.

The address register 10 and the data resister 13 comprise a plurality of identical stages, each of which is coupled to one of the six address lines in the bus 34 and one of the twelve data lines in the bus 36, respectively.

Figures 3, 4, 5, 6, 7:
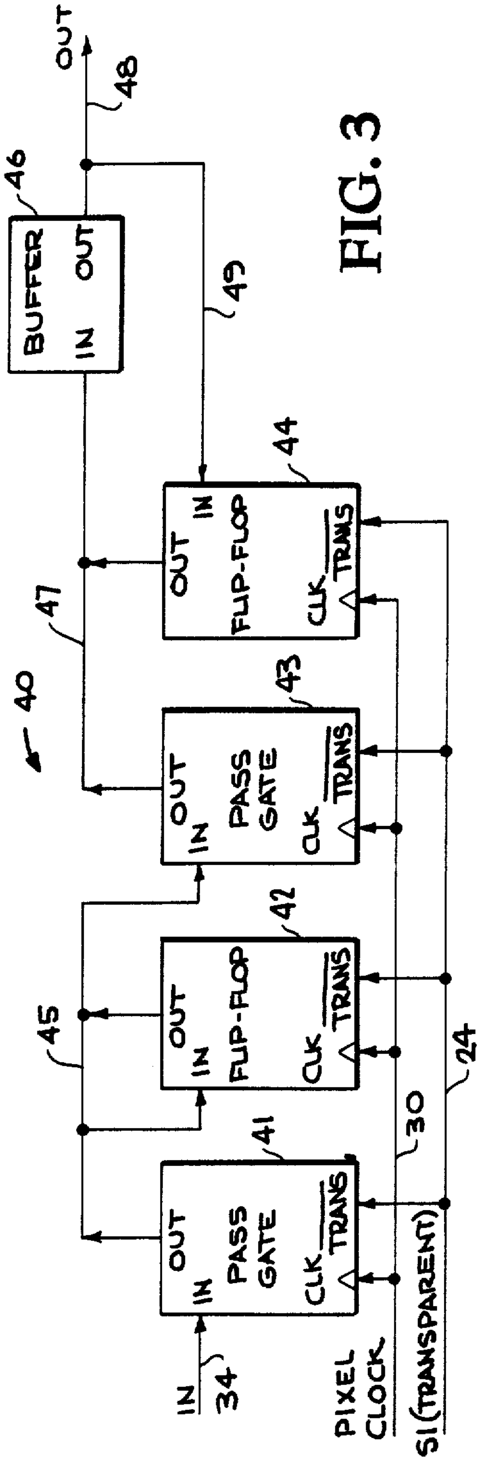
FIG. 3 is a block diagram of one of the stages in the address and data registers of the embodiment of FIG. 1.
FIGS. 4–7 are truth tables descriptive of the operation of the apparatus of FIG. 3.

Referring to FIG. 3, each of the stages in the address register 10 and data register 13 comprises a pass gate and flip-flop circuit designated generally as 40. In the circuit 40 there is provided a first pass gate circuit 41, a first flip-flop circuit 42, a second pass gate circuit 43, and a second flip-flop circuit 44. In each of the circuits, 41–44 there is provided a data input designated IN, a data output designated OUT, a clock input designated CLK and a control signal input designated $\overline{TRANS}$.

The clock inputs of the circuits 41–44 are coupled in parallel to the pixel clock signal line 30. The $\overline{TRANS}$ control signal inputs of the circuits 41–44 are coupled in parallel to the control signal line 24. The data input IN of the pass gate 41 in the address register 10 is coupled to one of the address lines in the address bus 34. In the data register 13, the data input IN of the pass gate 41 is coupled to a data bit output of the memory 12. The data output OUT of the pass gate 41 is coupled to the data input IN and the data output OUT of the flip-flop 42 and the data input IN of the pass gate circuit 43 by means of a data signal line 45. The data output OUT of the pass gate circuit 43 and the data output of the flip-flop circuit 44 are coupled to a buffer 46 by means of a data signal line 47. The output of the buffer 46 is provided on a data output signal line OUT 48 and is also coupled to the data input IN of the flip-flop circuit 44 by means of a data signal line 49. In the address register 10, the line 48 is coupled to the address lines of the memory 12. In the data register 13, the line 48 is coupled to one of the data lines in the bus 36.

Referring again to FIG. 1, the color monitor 17 comprises a plurality of triads of red, green and blue pixels and three electron guns (not shown) coupled to the outputs of the red, green and blue digital-to-analog converters 14–16 by the analog signal lines 37–39, respectively.

For purposes of describing the operation of the present invention, it is assumed that the memory 6 comprises six planes of memory cells for storing a plurality of 6-bit words, the total number of which equals the number of pixel triads on the monitor 17, that the shift registers 7 comprise a corresponding number of six 8-bit shift registers, that the memory 12 comprises storage for 64 12-bit words, and that the address for addressing each word in the memory 12 comprises a corresponding number of six bits. Of the twelve bits in each word in the memory 12, three sets of four bits are used for controlling each of the red, green and blue digital-to-analog converters 14–16, respectively.

The system 1 comprises two modes of operation: a refresh mode and a color palette or table look-up memory update mode.

In the refresh mode, words are read from the display memory 6 into the shift registers 7 under the control of the graphics processor 5. Typically, words, each comprising one bit from each of the display memory planes $6_0$–$6_{n-1}$, are shifted from the memory planes into the shift register $7_0$–$7_{n-1}$. In practice, eight words are shifted into the shift registers 7 in parallel. Thereafter, each of the words are shifted out of the shift registers 7 onto the video address bus 33, through the multiplexer 8 and into the address register 10.

In the address register 10, the words from the display memory 6 are interpreted as addresses of the words in the color table look-up memory 12. As each word is addressed in the color table look-up memory 12, it is read out of the memory 12 into the data register 13. From the data register 13, three sets of four bits from each of the data words are transferred to each of the red, green and blue digital-to-analog converters 14–16, respectively. In the DAC's 14–16, the bits are converted to an analog signal which are provided on the analog control signal lines 37–39, respectively. The analog control signal lines 37–39 then feed the analog signals to the inputs of three electron guns in the video monitor 17 for controlling the intensity of the red, green and blue pixels in each of the triads on the monitor. With six address bits, up to 64 words can be addressed in the memory 12 providing up to 64 different combinations of red, green and blue pixel intensities.

During the refresh mode, the address register 10, the data register 13 and the memory 12 are operated in a pipeline fashion. That is, as a data word is read from the data register 13 to the DAC's 14–16 in synchronism with a pixel clock pulse, the address of the next data word to be read from the memory 12 is shifted from the display memory 6 through the shift registers 7 and into the address register 10 in synchronism with the same clock pulse.

Referring to FIG. 2, during a refresh mode, the chip-enable signal $\overline{CS}$ is high, the write/read control signal $\overline{W}/R$ is a don't care, the control signal S1 is high and the control signal S0 is high.

In the color table look-up memory update mode, data is transferred between the CPU 2 and the color table look-up memory 12 in an asynchronous manner. To access data in the memory 12 in an asynchronous manner, the address register 10 is rendered transparent to addresses applied to its input and the data register 13 is rendered transparent to data words applied to its input. That is, when the memory 12 is operated asynchronously, it is operated independent of the pixel clock pulses applied thereto. These conditions are established by the CPU 2 when the chip enable signal $\overline{CS}$ is driven low, causing the control signal S1 to also be driven low. Thereafter, the read/write control signal $\overline{WR}$ is controlled by the control signal $\overline{W}/R$ from the CPU 2 to drive S0 high or low depending on whether a read or write operation is intended, as shown in the truth table of FIG. 2.

Referring to FIG. 2, to avoid a loss of data in the memory 12 during a "write" operation it is important, first, that the control signal $\overline{WR}$ be driven from a high to a low at the beginning of the write operation only after the multiplexer 8 has been switched and the address register 10 has become stable in response to an address on the system address bus 20; and, second, that the control signal $\overline{WR}$ be driven from a low to a high at the end of the write operation immediately upon a change of state of S1and S0.

Referring to the unidirectional delay circuit 26, after S1is driven low, S0 is either driven high or low. If S0 is driven from a high to a low, as is required for a write operation, a change in the output of the OR gate 27 will be delayed by the delay circuit 28. The amount of delay is chosen to insure that the address register 10 has become stabilized on an address on the system address bus 20. On the other hand, when the control signal S0 is driven from a low to a high, the level of the output $\overline{WR}$ of the OR gate 27 follows S0 without delay, thus insuring that the write operation is terminated before the address register 10 is changed.

Referring to FIG. 3 and the truth tables in FIGS. 4–7, the operation of the address register 10 and the data register 13 will now be described in detail, it being understood that the circuit 40 of FIG. 3 corresponds to only one stage in each of the registers and that in the embodiment of FIG. 1, the address register 10 comprises six such circuits 40 and the data register 13 comprises twelve such circuits 40.

In operation, as shown in the truth tables of FIGS. 4–7, when CPU 2 drives the control signal S1 high, the circuit 40 is operated in synchronism with the pixel clock pulses applied to the clock signal line 30 to transfer signal pulses through the circuit on the rising edge of the clock pulses. For example, assuming as an initial condition that the signal on the output line 48 is a "1" and that a "0" is applied to input line 34. As long as the clock pulse is low, i.e. a "0", the input will not change the output. However, the "0" applied to line 34 will be passed through pass gate 41 and appear on line 45, as shown in the first line of FIG. 4. With flip-flop 42 off, i.e. its output in a high impedance state, and pass gate 43 disabled, the "0" on line 45 is blocked at the input to pass gate 43 and the "1" on the input of flip-flop 44 is latched to the output coupled to line 47, as shown in the first line of FIGS. 5–7.

When the pixel clock goes from a low to a high, i.e. "0" to a "1", the circuit 40 functions as shown on line 2 of FIGS. 4–7. The pass gate 41 is disabled. The "0" on line 45 is latched by the flip-flop 42 and passed through the pass gate 43, latched by the flip-flop 44 and appears on the output line 48.

From the foregoing description, it is seen that the output appearing on line 48 will follow the input appearing on line 34 with the rising edge of each clock pulse.

In contrast to the above-described synchronous operation of the address and data registers 10 and 13 during the refresh mode, the following is a description of the operation of the circuit 40 during the memory 12 update mode.

The memory 12 update mode is initiated when the CPU drives S1 low, i.e. to a "0". When S1 is driven low, the input signal applied to line 34 is transferred to the output line 48 within two gate delays and independent of the level of the pixel clock pulses appearing on line 30. As shown in FIGS. 4–7, on lines 3 and 4 when S1 is a "0", the pass gates 41 and 43 are enabled, the outputs of the flip-flops 42 and 44 are placed in a high impedance state and neither the pass gates 41 and 43 or the flip-flops 42 and 44 are affected by the level of the pixel clock pulse.

While a preferred embodiment of the present invention is described above, it is contemplated that various changes may be made thereto without departing from the spirit and scope thereof. Accordingly, it is intended that the above description be considered only as illustrative of the invention and that the scope thereof be determined by reference to the claims hereinafter provided.

What is claimed is:

1. A color graphics system comprising:

a memory;

a first source of memory addresses;

a second source of memory addresses;

a source of clock pulses;

a source of a first and a second control signal;

means connected to said memory, said first source of memory addresses, said second source of memory addresses, said source of clock pulses, and said source of said first and said second control signals for selectively accessing said memory in a synchronous manner using addresses from said first source of memory addresses in synchronism with clock pulses from said source of clock pulses in response to said first control signal and in an asynchronous manner using addresses from said second source of memory addresses independent of said clock pulses in response to said second control signal.

2. A system according to claim 1 wherein said source of clock pulses comprises a video timing generator and said clock pulses from said source comprise pixel clock pulses having a pulse rate used for scanning pixels on a monitor in said system.

3. A system according to claim 1 wherein said memory comprises a random access memory, said first source of memory addresses comprises a video address bus and said second source of memory addresses comprises a central processing unit system address bus.

4. A system according to claim 1 wherein said memory accessing means comprises:

means for registering said addresses from said first and second sources of memory addresses; and means for selectively transferring said addresses from said first source of memory addresses to said means for registering said addresses in synchronism with said clock pulses from said source of clock pulses in response to said first control signal and from said second source of memory addresses to said means for registering said addresses in an asynchronous manner in response to said second control signal.

5. A system according to claim 4 wherein said first source of memory addresses comprises a video address bus, said second source of memory addresses comprises a central processing unit (CPU) system address bus, and said transferring means comprises means for transferring addresses from said video address bus to said means for registering said addresses in response to said first control signal and from said CPU system address bus to said means for registering said addresses in response to said second control signal.

6. A system according to claim 5 wherein said transferring means comprises:

a multiplexer having a first output coupled to said video address bus;

a second input coupled to said system address bus;

an output coupled to said means for registering said addresses;

a control signal input coupled to a source of said first and said second control signals; and means responsive to said first and said second control signals for selectively coupling said first and said second inputs and said output.

7. A system according to claim 1 wherein said first source of memory addresses comprises:

a video display memory; and means for transferring an address from said video display memory to a video address bus.

8. A system according to claim 7 wherein said means for transferring an address from said video display memory to a video address bus comprises:

means located between said video display memory and said video address bus for registering said addresses from said video display memory;

means for transferring a plurality of addresses in parallel from said video display memory to said address registering means; and means for transferring each of said addresses sequentially from said address registering means to said video address bus.

9. A system according to claim 1 wherein said memory accessing means comprises:

means having an output for registering data; and means located in said data registering means for selectively transferring a data word from said memory to said output of said data registering means in synchronism with said clock pulses in response to said first control signal and from said memory to said output of said data registering means in an asynchronous manner independent of said clock pulses in response to said second control signal.

10. A system according to claim 9 comprising:

means having a digital input, an analog output and an input for receiving said clock pulses for converting digital signals to analog signals;

a video monitor having means for illuminating colored pixel triads on a screen;

means for coupling said digital input to said output of said data registering means; and means for coupling said analog output to said colored pixel triad illuminating means.

11. A system according to claim 4 wherein said means for registering said addresses comprises:

first and second means for gating signals and first and second means for latching signals, each of said gating and latching means comprising an input for receiving an input signal, an output for providing an output signal, an input for receiving clock pulses and an input for receiving said first and said second control signals;

means for coupling said outputs of said first gating means and said first latching means to said inputs of said first latching means and said second gating means;

means for coupling said outputs of said second gating means and said second latching means to said input of said second latching means;

means for coupling all of said inputs for receiving said clock pulses in parallel to said source of clock pulses;

means for coupling all of said inputs for receiving said first and said second control signals in parallel to said source of said control signals; and means located in said gating and latching means for selectively transferring an input signal applied to said input of said first gating means to said output of said second latching means in synchronism with said clock pulses in response to said first control signal and asynchronously independent of said clock pulses in response to said second control signal.

12. A system according to claim 9 wherein said data registering means comprises:

first and second means for gating signals and first and second means for latching signals, each of said gating and latching means comprising an input for receiving an input signal, an output for providing an output signal, an input for receiving clock pulses and an input for receiving said first and said second control signals;

means for coupling said outputs of said first gating means and said first latching means to said inputs of said first latching means and said second gating means;

means for coupling said outputs of said second gating means and said second latching means to said input of said second latching means;

means for coupling all of said inputs for receiving said clock pulses in parallel to said source of clock pulses;

means for coupling all of said inputs for receiving said first and said second control signals in parallel to said source of said control signals; and means located in said gating and latching means for selectively transferring an input signal applied to said input of said first gating means to said output of said second latching means in synchronism with said clock pulses in response to said first control signal and asynchronously independent of said clock pulses in response to said second control signal.

13. A color graphics system comprising:

a memory;

a first source of memory addresses;

a second source of memory addresses;

a source of clock pulses;

a color monitor; and means for selectively accessing said memory to refresh said monitor using words from said memory which are accessed using addresses from said first source of addresses in synchronism with said clock pulses in response to a first control signal and to write into and read from said memory using addresses from said second source of addresses asynchronously independent of said clock pulses in response to a second control signal.

14. A system according to claim 13 wherein said accessing means comprises means for registering addresses and data coupled to said memory and said registering means comprises:

first and second means for gating signals and first and second means for latching signals, each of said gating and latching means comprising an input for receiving an input signal, an output for providing an output signal, an input for receiving clock pulses and an input for receiving said first and said second control signals;

means for coupling said outputs of said first gating means and said first latching means to said inputs of said first latching means and said second gating means;

means for coupling said outputs of said second gating means and said second latching means to said input of said second latching means;

means for coupling all of said inputs for receiving said clock pulses in parallel to said source of clock pulses;

means for coupling all of said inputs for receiving said first and said second control signals in parallel to said source of said control signals; and means located in said gating and latching means for selectively transferring an input signal applied to said input of said first gating means to said output of said second latching means in synchronism with said clock pulses in response to said first control signal and asynchronously independent of said clock pulses in response to said second control signal.

15. In a color graphics system having:

a memory;

a first source of memory addresses;

a second source of memory addresses;

a source of clock pulses; and a source of a first and a second control signal; a method of accessing said memory comprising the steps of:

accessing said memory in a synchronous manner using addresses from said first source of memory addresses in synchronism with clock pulses from said source of clock pulses in response to said first control signal; and accessing said memory in an asynchronous manner using addresses from said second source of memory addresses independent of said clock pulses in response to said second control signal.

16. A method according to claim 15 wherein said step of using addresses in synchronism with clock pulses from said source of clock pulses comprises the step of using addresses in synchronism with pixel clock pulses from a video timing generator, said pixel clock pulses having a pulse rate used for scanning pixels on a monitor in said system.

17. A method according to claim 15 wherein each of said steps of accessing said memory comprises the step of accessing a random access memory, said step of using addresses from said first source of memory addresses comprises the step of using addresses from a video address bus and said step of using addresses from said second source of memory addresses comprises the step of using addresses from a central processing unit system address bus.

18. A method according to claim 15 wherein said accessing steps comprise the steps of:

transferring said addresses from said first source of memory addresses to an address registering means in synchronism with said clock pulses from said source of clock pulses in response to said first control signal; and transferring said addresses from said second source of memory addresses to said address registering means in an asynchronous manner in response to said second control signal.

19. A method according to claim 18 wherein said first source of memory addresses comprises a video address bus, said second source of memory addresses comprises a central processing unit (CPU) system address bus, and said transferring steps comprise the steps of:

transferring addresses from said video address bus to said address registering means in synchronism with said clock pulses in response to said first control signal; and transferring addresses from said CPU system address bus to said address registering means independent of said clock pulses in response to said second control signal.

20. A method according to claim 19 wherein said transferring steps comprise the steps of:

providing a multiplexer having a first input coupled to said video address bus;

a second input coupled to said system address bus;

an output coupled to said address registering means;

a control signal input coupled to a source of said first and said second control signals; and selectively coupling said first and said second inputs and said output in response to said first and said second control signals, respectively.

21. A method according to claim 20 wherein said first source of memory addresses comprises:

a video display memory; and said transferring steps comprise the step of:

transferring an address from said video display memory to said video address bus.

22. A method according to claim 21 wherein said latter address transferring step comprises the steps of:

registering said addresses from said video display memory in a means for registering addresses located between said video display memory and said video address bus;

transferring a plurality of addresses in parallel from said video display memory to said latter address registering means; and transferring each of said addresses sequentially from said latter address registering means to said video address bus.

23. A method according to claim 15 wherein said memory accessing steps comprises the steps of:

transferring a data word from said memory to a data registering means in synchronism with said clock pulses in response to said first control signal; and transferring a data word from said memory to said data registering means in an asynchronous manner independent of said clock pulses in response to said second control signal.

24. A method according to claim 23 comprising the steps of:

providing a means having a digital input, an analog output and an input for receiving said clock pulses for converting digital signals to analog signals; and providing a video monitor having means for illuminating colored pixel triads on a screen; and wherein said transferring steps comprise the steps of:

coupling said digital input to said output of said data registering means; and coupling said analog output to said colored pixel triad illuminating means.

25. A method according to claim 15 wherein said memory accessing steps comprise the steps of:

providing a first and second means for gating signals and first and second means for latching signals, each of said gating and latching means comprising an input for receiving an input signal, an output for providing an output signal, an input for receiving clock pulses and an input for receiving said first and said second control signals;

providing means for coupling said outputs of said first gating means and said first latching means to said inputs of said first latching means and said second gating means;

providing means for coupling said outputs of said second gating means and said second latching means to said input of said second latching means;

providing means for coupling all of said inputs for receiving said clock pulses in parallel to said source of clock pulses;

providing means for coupling all of said inputs for receiving said first and said second control signals in parallel to said source of said control signals; and providing means located in said gating and latching means for selectively transferring an input signal applied to said input of said first gating means to said output of said second latching means in synchronism with said clock pulses in response to said first control signal and asynchronously independent of said clock pulses in response to said second control signal.

* * * * *